United States Patent
Seo et al.

(10) Patent No.: US 7,948,330 B2
(45) Date of Patent: May 24, 2011

(54) CURRENT CONTROLLED OSCILLATOR WITH REGULATED SYMMETRIC LOADS

(75) Inventors: Dongwon Seo, San Diego, CA (US); Sameer Wadhwa, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 103 days.

(21) Appl. No.: 12/407,113

(22) Filed: Mar. 19, 2009

(65) Prior Publication Data

US 2010/0237952 A1 Sep. 23, 2010

(51) Int. Cl.
*H03L 1/00* (2006.01)
*H03K 3/03* (2006.01)

(52) U.S. Cl. .......... 331/186; 331/57; 331/17; 331/177 R

(58) Field of Classification Search .................. 331/185, 331/186, 57, 177 R, 17; 327/149, 153, 158, 327/161, 231, 236, 261, 269, 270, 271, 277

See application file for complete search history.

(56) References Cited

U.S. PATENT DOCUMENTS

| | | | |
|---|---|---|---|
| 5,727,037 A | 3/1998 | Maneatis | |
| 5,764,110 A | 6/1998 | Ishibashi | |
| 6,229,403 B1* | 5/2001 | Sekimoto | ........................ 331/57 |
| 7,292,106 B2 | 11/2007 | Maneatis | |
| 2005/0046495 A1 | 3/2005 | Li | |

OTHER PUBLICATIONS

International Search Report—PCT/US2010/027859—International Search Authority, European Patent Office, Jun. 16, 2010.

* cited by examiner

*Primary Examiner* — Robert Pascal
*Assistant Examiner* — Ryan Johnson
(74) *Attorney, Agent, or Firm* — Jiayu Xu

(57) ABSTRACT

An integrated circuit incorporating a bias circuit for a current-controlled oscillator (ICO) with improved power supply rejection ratio (PSRR) is described. The bias circuit for the ICO includes two error amplifiers. The first error amplifier regulates the bias voltage, $V_{BN}$, referenced to a ground supply (GND). The second error amplifier regulates the bias voltage, $V_{BP}$, referenced to a positive power supply ($V_{DD}$). The $V_{BP}$ and $V_{BN}$ bias voltages have improved PSRR relative to conventional ICO bias circuits for noise injected into $V_{DD}$ and GND.

17 Claims, 5 Drawing Sheets

CURRENT CONTROLLED OSCILLATOR WITH REGULATED SYMMETRIC LOADS

TECHNICAL FIELD

The present disclosure relates generally to integrated circuits, and more specifically to low-jitter/low-voltage phase-locked loop and current controlled oscillator circuits.

BACKGROUND

Low-jitter/low-voltage phase-locked loops and current-controlled oscillators (PLL-ICOs) operating in noisy power-supply environments with other digital circuits are increasingly important in integrated circuit (IC) designs. These PLL-ICOs are needed to generate clock frequencies for different functional blocks in an IC, such as general purpose processor/memory clocks, analog to digital and digital to analog converter clocks, audio CODEC clocks, digital signal processing clocks, external interface clocks, etc.

In particular, embedded analog circuits such as PLL-ICOs rely on a wide-band noise-free power-supply ($V_{DD}$) to meet clock phase-noise and timing-jitter requirements. As IC designs progress towards embedding more analog circuits along with digital processors in the same silicon die, it becomes more difficult in the IC design to include independent low-noise power-supply ($V_{DD}$) connections for each embedded analog core. Low Drop-Out (LDO) voltage regulators have been traditionally used to meet this requirement. However, designing wide-band power supply rejection ratio (PSRR) LDO voltage regulators, using only on-chip components is a difficult design task and there may be a substantial silicon die area penalty for each additional wide-band PSRR LDO voltage regulator.

Traditionally, on-chip PLL-ICOs use independent power-supply ($V_{DD}$) bumps to get a clean power supply ($V_{DD}$) connections. The number of power-supply ($V_{DD}$) bumps increases as multiple PLLs are integrated into an IC. The number of power-supply ($V_{DD}$) bumps and silicon die bond pads increases as multiple PLL-ICOs and other embedded analog cores are integrated into an IC. The power-supply ($V_{DD}$) bumps refer to a solder ball connection between a packaged integrated circuit (packaged IC) and the main application circuit board. By improving the PSRR of individual circuit blocks on the IC, such as any PLL-ICOS, the number of power-supply ($V_{DD}$) and ground (GND) connections can be minimized, thereby reducing the packaged IC pin count, IC and main application circuit board routing complexity.

There is a need for a low-jitter PLL-ICO with improved power supply rejection ratio (PSRR) for integration with other circuit blocks in an IC design. A substantial improvement in PLL-ICO PSRR allows a high-speed/low-jitter PLL-ICO to share power supply ($V_{DD}$) connection(s) with other circuit blocks within an IC design; thereby IC die size is reduced, die floor-plan and layout are simplified, IC package and die pin count are lessened, and ultimately IC cost is lowered.

SUMMARY

An integrated circuit is described incorporating a bias circuit for a current-controlled oscillator (ICO) with improved power supply rejection ratio (PSRR) is described. The bias circuit for the ICO includes two error amplifiers. The first error amplifier regulates the bias voltage, $V_{BN}$, referenced to a ground supply (GND). The second error amplifier regulates the bias voltage, $V_{BP}$, referenced to a positive power supply ($V_{DD}$). The $V_{BP}$ and $V_{BN}$ bias voltages have improved PSRR relative to conventional ICO bias circuits for noise injected into $V_{DD}$ and GND.

Figure 1:
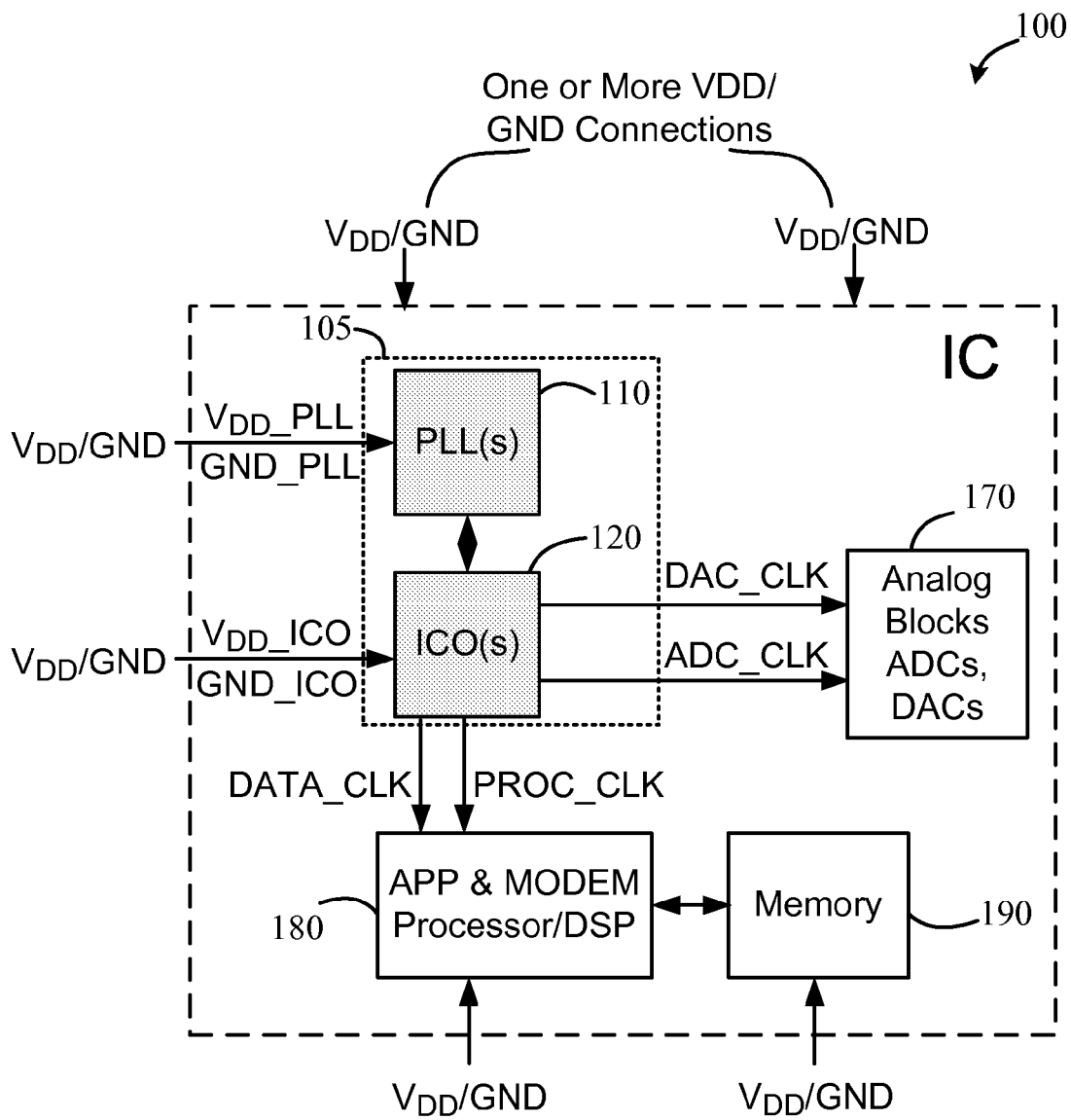
FIG. 1 shows a block diagram of an integrated circuit (IC) with PLL and ICO circuit blocks sharing power supply connections with other digital and analog circuit blocks.

To facilitate understanding, identical reference numerals have been used where possible to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The device described therein may be used for various IC designs including, but not limited to wireless communication devices for cellular, PCS, and IMT frequency bands and air-interfaces such as CDMA, TDMA, FDMA, OFDMA, and SC-FDMA. In addition to cellular, PCS or IMT network standards and frequency bands, this device may be used for local-area or personal-area network standards, WLAN, Bluetooth, & ultra-wideband (UWB).

FIG. 1 shows a block diagram of an integrated circuit (IC) with PLL and ICO circuit blocks sharing power supply connections with other digital and analog circuit blocks in accordance with the present embodiment as shown. IC 100 includes one or more PLL-ICOs 105 that may generate any number of clock signals required to operate multiple circuit blocks within the IC or sent to external circuits and signal interfaces. Individual PLL(s) 110 and ICO(s) 120 may be customized for different frequency ranges and jitter specifications. IC 100 may integrate many different functions, including analog-to-digital/digital-to-analog 170, processor(s) 180, memory 190, and may be implemented in sub-micron semiconductor geometry (silicon for example) processes (65 nm or 45 nm CMOS are current example processes) and may be optimized for wireless communication device applications. In current silicon processes for wireless communication device applications with battery-powered operation, IC 100 must be designed with supply voltages as low as possible to operate with minimal power consumption and within the breakdown voltage of the silicon process. Although there are multiple external positive power supply ($V_{DD}$) and ground supply (GND) connections, ideally individual circuit blocks may need noise-free power supplies if the power-supply rejection ratio (PSRR) of individual circuit blocks is not optimal.

Figure 2:
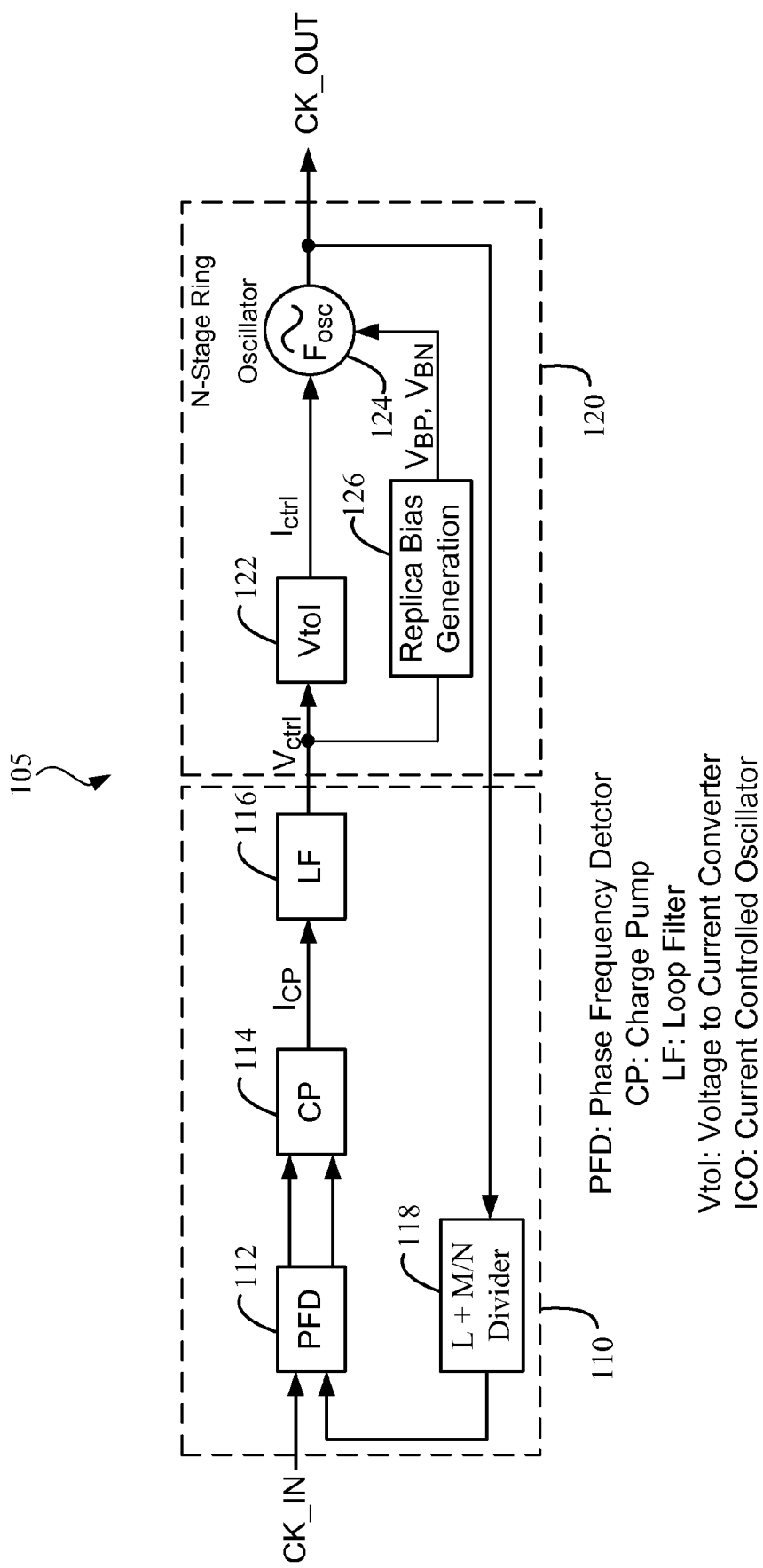
FIG. 2 shows a schematic diagram of a PLL-ICO circuit block.

FIG. 2 shows a schematic diagram of a PLL-ICO circuit block 105 of FIG. 1 in accordance with the present embodiment as shown. PLL-ICO circuit block 105 includes PLL 110 and ICO 120. PLL 110 includes a reference clock input, CK_IN. PLL 110 also includes a phase-frequency detector (PFD 112), a charge pump (CP 114), a loop filter (LF 116), and a L+M/N divider 118. ICO 120 includes an input signal, $V_{ctrl}$, and an output signal, CK_OUT. ICO 120 also includes a VtoI converter (VtoI 122), a current controlled oscillator (N-stage Ring Oscillator 124) with output frequency $F_{OSC}$, and a replica bias generation circuit (bias circuit 126).

Under normal PLL-ICO 105 operation, CK_IN is compared with the L+M/N divider 118 output clock utilizing PFD 112. PFD 112 generates a series of UP and DOWN pulses to indicate that the N-Stage Ring Oscillator 124 is either above or below the desired frequency at each phase comparison cycle with CK_IN.

The UP and DOWN pulses control CP 114. CP 114 outputs UP or DOWN current pulses of a pre-determined amplitude but with a duration that is dependent on the phase difference between the two input clock signals at a node labeled $I_{CP}$. $I_{CP}$ is filtered by LF 116 to create an analog control voltage labeled $V_{ctrl}$. $V_{ctrl}$ is the input signal to ICO 120. Within ICO 120, $V_{ctrl}$ is converted to a control current (utilizing VtoI 122), $I_{ctrl}$, along with $V_{BP}$ and $V_{BN}$ by bias circuit 126, to adjust the N-Stage Ring Oscillator 124 output, CK_OUT, frequency, $F_{OSC}$.

There may be an inverter between PFD 112, CP 114, and LF 116 since VtoI 122 typically inverts the relationship between $V_{ctrl}$ and N-Stage Ring Oscillator 124 output frequency ($F_{OSC} \sim -V_{ctrl}$). The two frequencies of signals CK_IN and CK_OUT÷(L+M/N), are equal in the PLL locked state and $V_{ctrl}$, $V_{BP}$, $V_{BN}$, and $I_{ctrl}$ converge to a set of stable bias voltages and current respectively.

As mentioned previously, designing PLL-ICOs to meet the requirements of these IC designs has been very challenging due to the tight jitter requirements required for high-speed operation and in wireless devices. The low-jitter and high-speed operational performance is impacted by the noise present on the power supply ($V_{DD}$) to the PLL-ICOs. This noise is increased in IC designs with a multitude of circuit blocks and processors integrated on the same silicon die. Each active circuit block may inject noise into the common power supply ($V_{DD}$) for individual PLL-ICOs and other functional blocks (both analog and digital power supplies).

The PLL-ICO circuit block 105 described herein may be used for various electronics circuits including communication circuits. For example, PLL-ICO circuit block 105 may be used in (1) a transmitter subsystem to generate a local oscillator (LO) signal used for frequency up-conversion, (2) a receiver subsystem to generate an LO signal used for frequency down-conversion, (3) a digital subsystem to generate clock signals used for synchronous circuits such as flip-flops and latches, and (4) other circuits and subsystems. For clarity, PLL-ICO circuit block 105 for a CMOS semiconductor IC device is described below.

Figure 3:
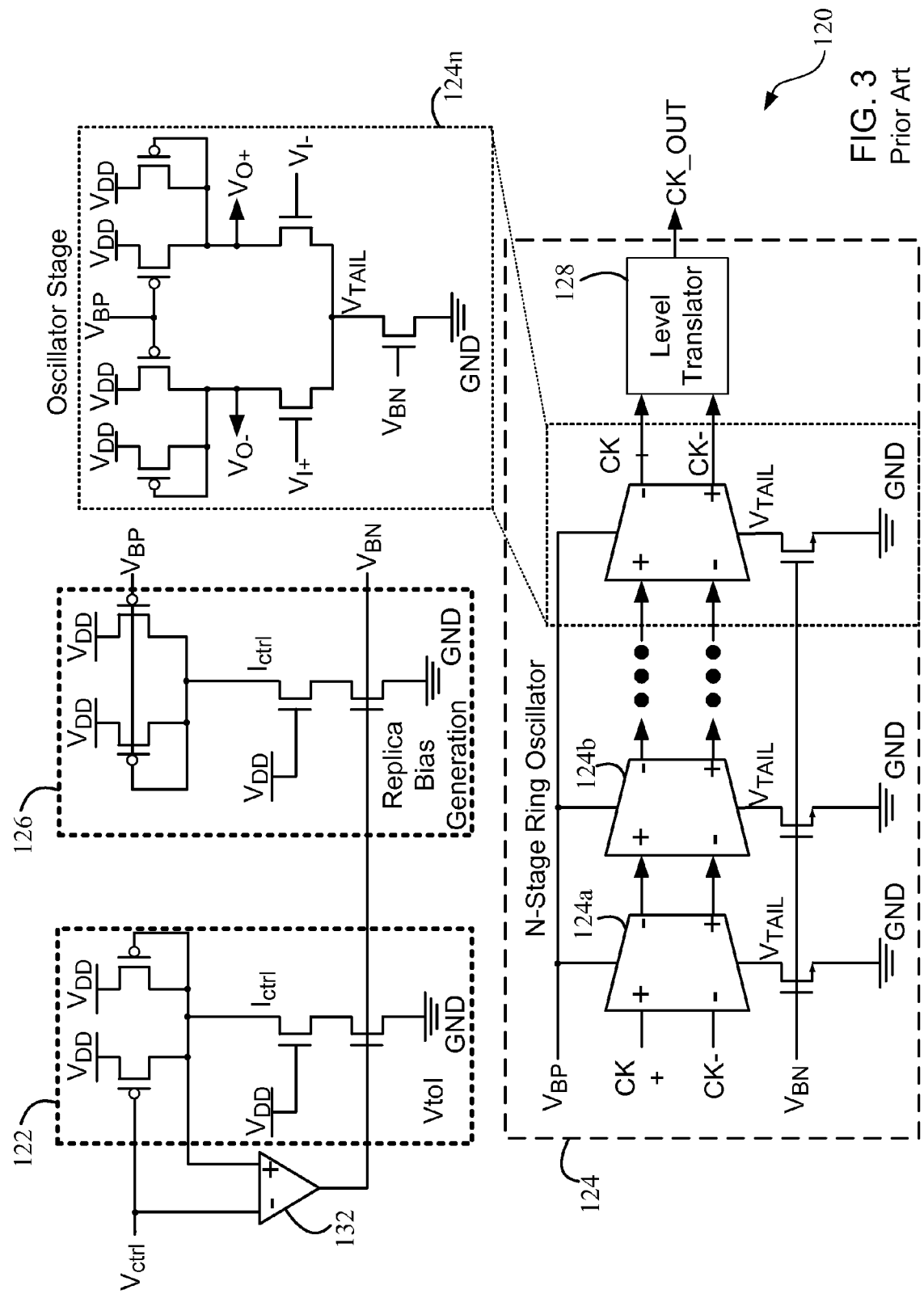
FIG. 3 shows a schematic diagram of a conventional current-controlled oscillator (ICO) with symmetric loads, utilizing a VtoI bias circuit to convert $V_{ctrl}$ to $I_{ctrl}$, $V_{BN}$ and $V_{BP}$ with error amplifier in the $V_{ctrl}$ to $V_{BN}$ signal path only.

FIG. 3 shows a schematic diagram of a conventional current-controlled oscillator (ICO) with symmetric loads, utilizing a VtoI bias circuit to convert $V_{ctrl}$ to $I_{ctrl}$, $V_{BN}$ and $V_{BP}$ with error amplifier in the $V_{ctrl}$ to $V_{BN}$ signal path only of FIG. 2 in accordance with the present embodiment as shown. ICO 120 includes a VtoI 122, a replica bias generation circuit 126, an error amplifier 132, and an N-stage ring oscillator (with stages 124a, 124b . . . 124n).

ICO 120 includes an input control voltage, $V_{ctrl}$, which is converted to a set of two bias voltages, $V_{BP}$ and $V_{BN}$ by VtoI 122, error amplifier 132, and replica bias generation circuit 126. $V_{BP}$ is a replica voltage of $V_{ctrl}$. $V_{BP}$ and $V_{BN}$ set the bias current, $I_{ctrl}$, in conventional ICO 120. Error amplifier 132 between $V_{ctrl}$ and $V_{BN}$ regulates the voltage relationship between $V_{ctrl}$ and $V_{BN}$.

$V_{BP}$ and $V_{BN}$ control N-Stage Ring Oscillator 124 composed of stages 124a, 124b, through 124n. The output amplitude of N-Stage Ring Oscillator 124 may be restored to digital logic levels with a level translator 128. In N-Stage Ring Oscillator 124, the number of stages is odd and either 3 or 5, however more stages may be added depending on the application for ICO 120.

Different ring oscillator stage designs are possible that may still utilize the bias circuit components 122, 126, & 132. As $V_{ctrl}$ is lowered in voltage, the bias current for the ICO 120, $I_{ctrl}$, increases along with $V_{BN}$. $V_{BP}$ tracks $V_{ctrl}$ or have the same polarity. As the bias current, $I_{ctrl}$, to the ICO 120 increases, the output frequency, CK_OUT (equal to $F_{OSC}$ from FIG. 2) also increases since the delay of each stage (124a through 124n) is decreased and as the rise and fall times at each stage output (124a through 124n) decreases.

The error amplifier 132 regulates the $V_{BN}$ voltage and optimizes the power supply rejection ratio (PSRR) from the ground (GND) rail connection only. The PSRR of the conventional ICO 120 circuit is limited by the match accuracy of VtoI 122 and replica bias generation circuit 126 that are tied to $V_{BN}$ since the replica bias generation circuit 126 uses current regulation rather than voltage regulation. There is no error amplifier in the $V_{ctrl}$ to $V_{BP}$ signal path and the PSRR is not optimized from the positive power supply ($V_{DD}$) rail connection as a result.

The same bias control circuit composed of VtoI 122, replica bias generation circuit 126 and error amplifier 132 may be utilized to control a delay-locked loop (DLL) rather than a phase-locked loop (PLL). The control principles are the same as shown in FIG. 3, except the propagation delay of the cascaded stages is proportional to $V_{ctrl}$ and $V_{BP}$ (and inversely proportional to $I_{ctrl}$ and $V_{BN}$).

Figure 4:
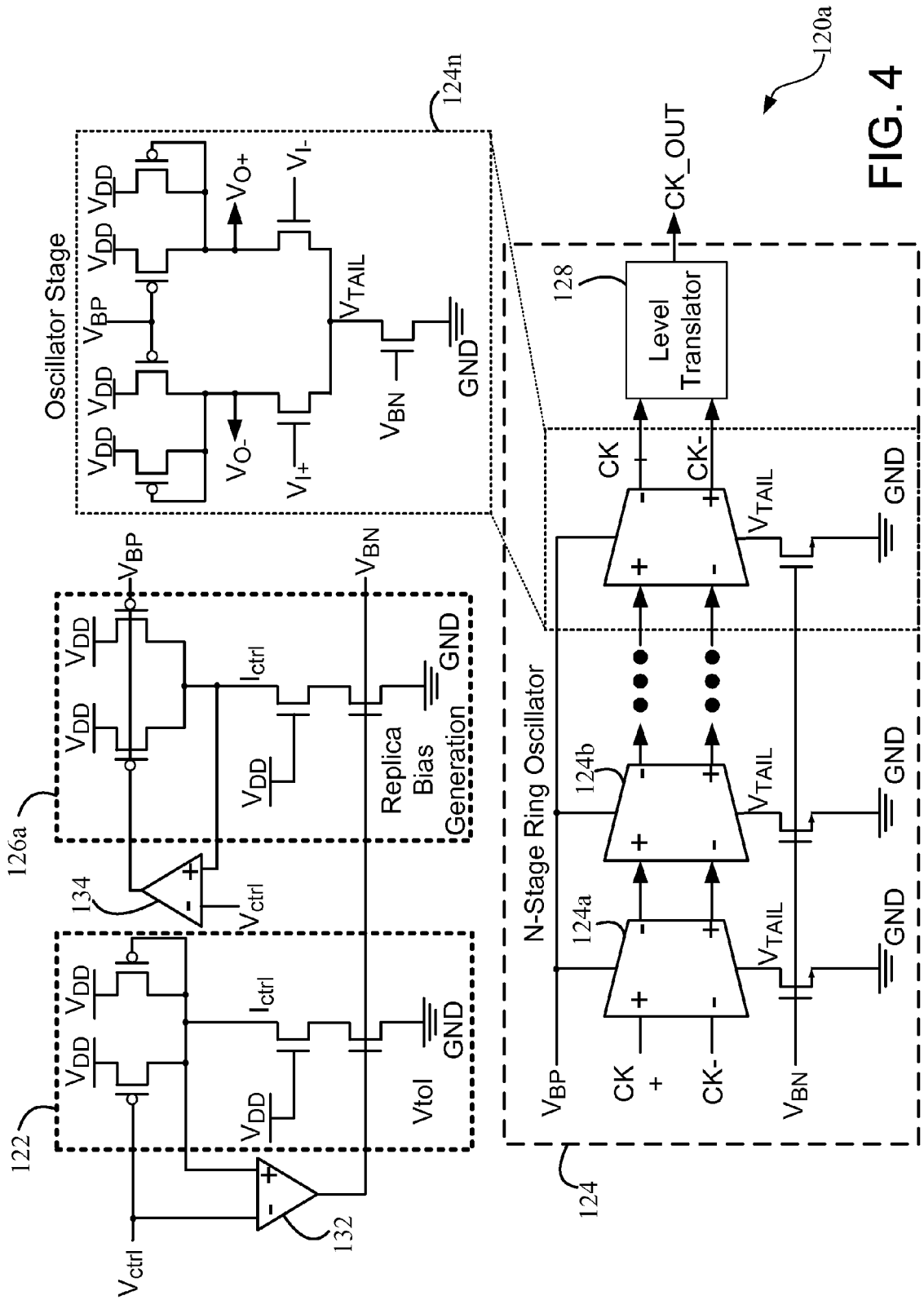
FIG. 4 shows a schematic diagram of an improved current-controlled oscillator (ICO) with symmetric loads, utilizing a VtoI bias circuit to convert $V_{ctrl}$ to $I_{ctrl}$, $V_{BN}$ and $V_{BP}$ with two error amplifiers—a first one in the $V_{ctrl}$ to $V_{BN}$ signal path and a second one in the $V_{ctrl}$ to $V_{BP}$ signal path.

FIG. 4 shows a schematic diagram of an improved current-controlled oscillator (ICO) with symmetric loads, utilizing a VtoI bias circuit to convert $V_{ctrl}$ to $I_{ctrl}$, $V_{BN}$ and $V_{BP}$ with two error amplifiers- a first one in the $V_{ctrl}$ to $V_{BN}$ signal path and a second one in the $V_{ctrl}$ to $V_{BP}$ signal path of FIG. 2 in accordance with the present embodiment as shown. ICO 120a includes a VtoI 122 (same as the ICO 120 of FIG. 3), a replica bias generation circuit 126a (reconfigured in FIG. 4), error amplifiers 132 (same as the ICO 120 of FIG. 3) and 134 (new in FIG. 4), and an N-stage ring oscillator (with stages 124a, 124b . . . 124n) (same as the ICO 120 of FIG. 3).

ICO 120a includes an input control voltage, $V_{ctrl}$, which is converted to a set of two bias voltages, $V_{BP}$ and $V_{BN}$ by VtoI 122, error amplifiers 132 and 134, and replica bias generation circuit 126a. $V_{BP}$ and $V_{BN}$ set the bias current, $I_{ctrl}$, in the improved ICO 120a. As shown in both ICO 120 (in FIG. 3) and 120a (in FIG. 4), error amplifier 132, between $V_{ctrl}$ and $V_{BN}$, regulates the voltage relationship between $V_{ctrl}$ and $V_{BN}$. Within ICO 120a only, error amplifier 134, between $V_{ctrl}$ and $V_{BP}$, regulates the voltage relationship between $V_{ctrl}$ and $V_{BP}$.

$V_{BP}$ and $V_{BN}$ control N-Stage Ring Oscillator 124 composed of stages 124a, 124b, through 124n. The output amplitude of N-Stage Ring Oscillator 124 may be restored to digital logic levels with a level translator 128. In N-stage Ring Oscillator 124, the number of stages is odd and either 3 or 5, however more stages may be added depending on the application for ICO 120a. Different ring-oscillator stage designs are possible that may still utilize the bias circuit components 122, 126a, & 132. As $V_{ctrl}$ is lowered in voltage, the bias current for the ICO 120a, $I_{ctrl}$, increases along with $V_{BN}$. $V_{BP}$ tracks $V_{ctrl}$ or have the same polarity.

As the bias current, $I_{ctrl}$, to the ICO 120a increases, the output frequency, CK_OUT (equal to $F_{OSC}$ from FIG. 2) also increases since the delay of each stage (124a through 124n) is decreased and as the rise and fall times at each stage output (124a through 124n) decreases. The error amplifier 132 regulates the $V_{BN}$ voltage and optimizes the power supply rejection ratio (PSRR) from the ground (GND) rail connection only as previously shown for ICO 120 in FIG. 3.

With the error amplifier 134 regulating the $V_{BP}$ voltage, the power supply rejection ratio (PSRR) of the ICO 120a from the power supply ($V_{DD}$) rail connection is improved relative to ICO 120 in FIG. 3. The power supply rejection ratio (PSRR) is improved in ICO 120a by observing that the output impedance of the $V_{BP}$ signal path is reduced relative to the conventional ICO 120 circuit as previously shown in FIG. 3.

The additional error amplifier 134 in FIG. 4 sets the $V_{BP}$ node output impedance to $1/(A(s)*R_{out})$, where A(s) is the additional error amplifier 134 loop gain. The A(s) should be a low-pass transfer function with a unity gain bandwidth of 100 MHz or greater and a DC gain of 40 to 50 dB. $R_{out}$ is the output impedance of additional error amplifier 134 is in the range of several hundred ohms.

As described for the conventional ICO 120 circuit as shown in FIG. 3, the $V_{BP}$ node output impedance is equal to the current mirror output impedance, 1/gm, where gm is the trans-conductance of the PMOS devices in the replica bias generation circuit 126a and is in the range of tens of milliamps/volt. Since A(s)*Rout>>gm over a wide frequency range, the output impedance of the $V_{BP}$ node is much lower in the improved ICO circuit 120a of FIG. 4 than the conventional ICO 120 circuit of FIG. 3; thereby the PSRR of the ICO 120a circuit in FIG. 4 is superior, over a range of noise frequencies present on $V_{DD}$ in comparison to the ICO 120 circuit of FIG. 3.

Another benefit of utilizing error amplifiers 132 and 134 in FIG. 4 for both $V_{BP}$ and $V_{BN}$ nodes, is to achieve the regulated symmetric loads, which further improves ICO 120a noise suppression in the presence of coupling paths from other circuit blocks into either the ground (GND) or positive power supply ($V_{DD}$) connections of the circuit.

The same bias control circuit composed of VtoI 122, replica bias generation circuit 126a, error amplifiers 132 and 134 may be utilized to control a delay-locked loop (DLL) rather than a phase-locked loop (PLL). The control principles are the same as shown in FIG. 3, except the propagation delay of the cascaded stages is proportional to $V_{ctrl}$ and $V_{BP}$ (and inversely proportional to $I_{ctrl}$ and $V_{BN}$).

Figure 5:
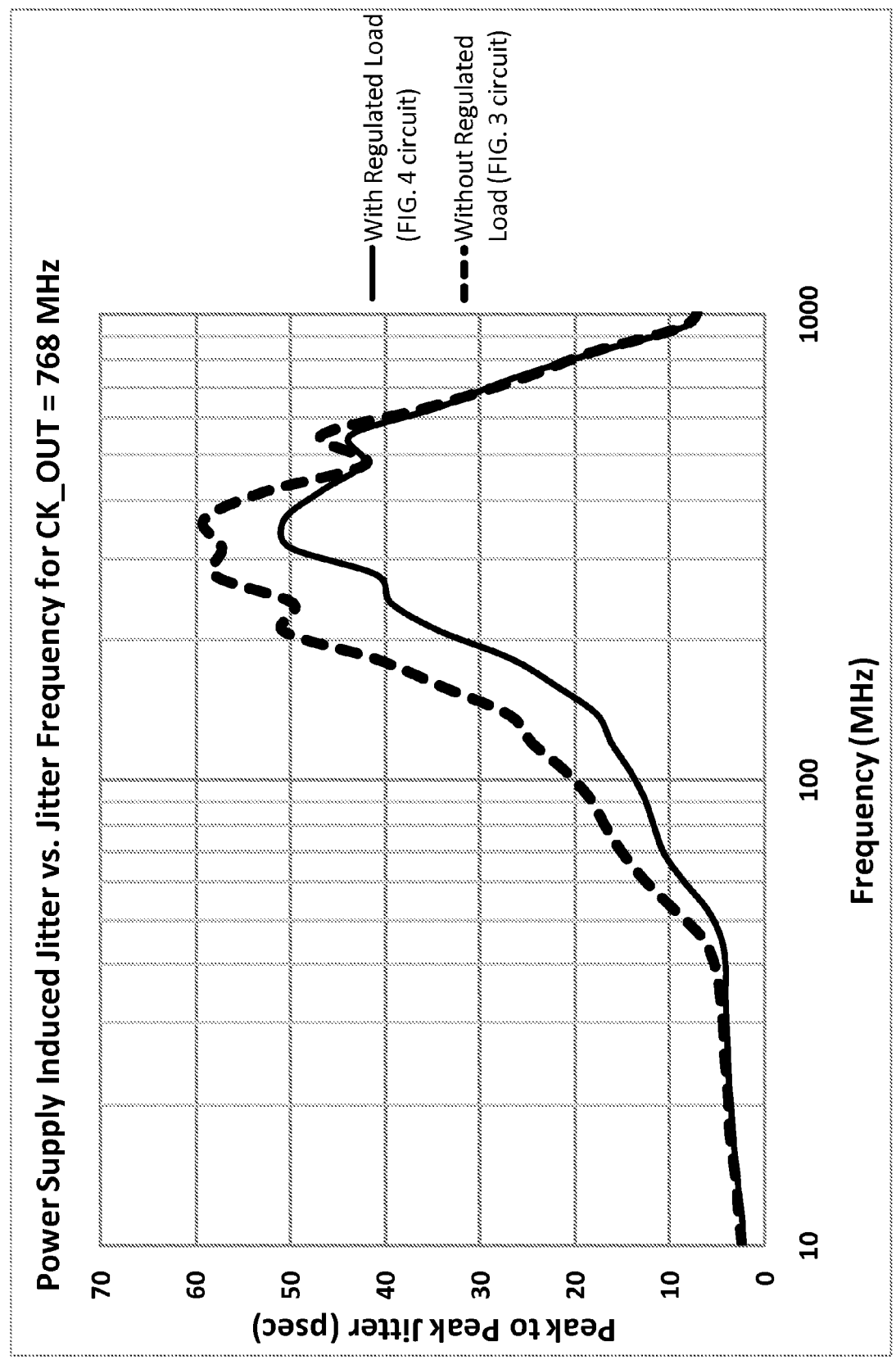
FIG. 5 shows a graph of the power supply ($V_{DD}$) induced clock jitter vs. jitter frequency for CK_OUT=768 MHz.

FIG. 5 shows a graph of the power supply ($V_{DD}$) induced clock jitter vs. jitter frequency for CK_OUT=768 MHz of FIGS. 3-4 in accordance with the present embodiment as shown. The PSRR of ICO 120 (from FIG. 3) and ICO 120a (from FIG. 4) are compared for an output frequency, $F_{OSC}$, equal to 768 MHz, with a 50 mV AC noise frequency sweep applied on $V_{DD}$ from 10 MHz to 1 GHz. For $V_{DD}$ noise below 500 MHz, the ICO 120a circuit in FIG. 4 demonstrates lower peak-to-peak jitter than a conventional ICO 120 circuit as previously shown in FIG. 3.

The definition of peak-to-peak jitter is given as $$\Delta T_{pk-pk} = Vm \times \frac{Kvco}{Fosc^2} \times \sqrt{1 - \cos(2\pi \times Fm/Fosc)},$$

where Vm is the amplitude of the $V_{DD}$ noise, Fosc is the ICO frequency (Hz), Kvco is the gain control slope (Hz/V) between $V_{ctrl}$ and ICO output frequency, and Fm is the frequency (Hz) of the $V_{DD}$ noise. As can be calculated with the peak-to-peak jitter equation, the peak-to-peak jitter reaches a maximum value for both ICO 120 and ICO 120a circuits when Fm=½×Fosc or 384 MHz.

Those of skill in the art would understand that signals may be represented using any of a variety of different techniques. For example, data, instructions, signals that may be referenced throughout the above description may be represented by voltages, currents, electromagnetic waves, magnetic fields or particles, or any combination thereof Those of skill would further appreciate that the various illustrative radio frequency or analog circuit blocks described in connection with the disclosure herein may be implemented in a variety of different circuit topologies, on one or more integrated circuits, separate from or in combination with logic circuits and systems while performing the same functions described in the present disclosure.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. A current-controlled oscillator (ICO) comprising:
a first voltage to current converter having an input receiving an input control voltage, and an output for producing a control current inversely proportional to the input control voltage;
a first error amplifier having a negative input receiving the input control voltage, a positive input receiving the first voltage to current converter output, and an output producing a bias voltage inversely proportional to the input control voltage;
a replica stage having an input receiving the bias voltage from the first error amplifier output, and an output producing a control current equivalent to the first voltage to current converter output control current; and
a second error amplifier having a negative input receiving the input control voltage, a positive input coupled to the replica stage output, and an output producing a bias voltage inversely proportional to the first error amplifier output bias voltage, the first error amplifier output and the second error amplifier output forming a pair of regulated symmetric loads to control a bias current of an N-stage current-controlled oscillator.

2. The ICO as recited in claim 1, wherein the ICO is configured to be controlled by a phase-locked loop (PLL).

3. The ICO as recited in claim 2, wherein the ICO and PLL are integrated circuits on a common substrate.

4. The ICO as recited in claim 3, wherein an output of the ICO is configured to clock a general purpose processor.

5. The ICO as recited in claim 3, wherein an output of the ICO is configured to clock a digital signal processor.

6. The ICO as recited in claim 3, wherein an output of the ICO is configured to clock an analog-to-digital converter (ADC).

7. The ICO as recited in claim 3, wherein an output of the ICO is configured to clock a digital converter (DAC).

8. The ICO as recited in claim 3, wherein an output of the ICO is configured to generate a local oscillator for a radio frequency circuit.

9. A current-controlled clock delay line comprising:
a first voltage to current converter having an input receiving an input control voltage, and an output for producing a control current inversely proportional to the input control voltage;
a first error amplifier having a negative input receiving the input control voltage, a positive input receiving the first voltage to current converter output, and an output producing a bias voltage inversely proportional to the input control voltage;
a replica stage having an input receiving the bias voltage from the first error amplifier output, and an output producing a control current equivalent to the first voltage to current converter output control current; and
a second error amplifier having a negative input receiving the input control voltage, a positive input coupled to the replica stage output, and an output producing a bias voltage inversely proportional to the first error amplifier output bias voltage, the first error amplifier output and the second error amplifier output forming a pair of regulated symmetric loads to control a bias current of an N-stage current-controlled delay line.

10. The clock delay line as recited in claim 9, wherein the clock delay line is configured to be controlled by a delay-locked loop (DLL).

11. The clock delay line as recited in claim 10, wherein the clock delay line and DLL are integrated circuits on a common substrate.

12. The clock delay line as recited in claim 11, wherein an output of the clock delay line is configured to provide a master clock and one or more time delayed clock signals.

13. The clock delay line as recited in claim 12, wherein the master clock and time delayed clock signals are configured to clock an analog-to-digital converter (ADC).

14. A method of regulating output bias voltages, $V_{BN}$ and $V_{BP}$, of an N-stage ring oscillator for improved power supply rejection ratio, comprising:
identifying a control voltage $V_{ctrl}$;
generating a control current $I_{ctrl}$ on the basis of the control voltage $V_{ctrl}$;
generating, using the control voltage $V_{ctrl}$ and control current $I_{ctrl}$, a regulated bias voltage $V_{BN}$ referenced to a ground supply GND;
generating, using the regulated bias voltage $V_{BN}$ and control voltage $V_{ctrl}$, a regulated bias voltage $V_{BP}$ referenced to a positive power supply $V_{DD}$; and
coupling the regulated bias voltages $V_{BP}$ and $V_{BN}$ to an input of the N-stage ring oscillator to adjust the N-stage ring oscillator output frequency.

15. The method of claim 14, wherein $V_{BP}$ and $V_{BN}$ are regulated symmetric loads.

16. A method of regulating output bias voltages, $V_{BN}$ and $V_{BP}$, of an N-stage clock delay line with improved power supply rejection ratio, comprising:
identifying a control voltage $V_{ctrl}$;
generating a control current $I_{ctrl}$ on the basis of the control voltage $V_{ctrl}$;
generating, using the control voltage $V_{ctrl}$ and control current $I_{ctrl}$, a regulated bias voltage $V_{BN}$ referenced to a ground supply GND;
generating, using the regulated bias voltage $V_{BN}$ and control voltage $V_{ctrl}$, a regulated bias voltage $V_{BP}$ referenced to a positive power supply $V_{DD}$; and
coupling the regulated bias voltages $V_{BP}$ and $V_{BN}$ to an input of the N-stage clock delay line to adjust the N-stage clock delay line input to output a delayed clock signal.

17. The method of claim 16, wherein $V_{BP}$ and $V_{BN}$ are regulated symmetric loads.

* * * * *